United States Patent
Okuda et al.

(10) Patent No.: US 7,667,480 B2
(45) Date of Patent: Feb. 23, 2010

(54) ANISOTROPIC CONDUCTIVE SHEET, ITS PRODUCTION METHOD, CONNECTION METHOD AND INSPECTION METHOD

(75) Inventors: Yasuhiro Okuda, Osaka (JP); Akihisa Hosoe, Osaka (JP); Taro Fujita, Osaka (JP)

(73) Assignee: Sumitomo Electric Industries, Ltd., Osaka (JP)

(*) Notice: Subject to any disclaimer, the term of this patent is extended or adjusted under 35 U.S.C. 154(b) by 0 days.

(21) Appl. No.: 12/093,232

(22) PCT Filed: Nov. 8, 2006

(86) PCT No.: PCT/JP2006/322271

§ 371 (c)(1),
(2), (4) Date: May 9, 2008

(87) PCT Pub. No.: WO2007/058101

PCT Pub. Date: May 24, 2007

(65) Prior Publication Data

US 2009/0115444 A1 May 7, 2009

(30) Foreign Application Priority Data

Nov. 21, 2005 (JP) .............................. 2005-336053

(51) Int. Cl.
*G01R 31/02* (2006.01)
(52) U.S. Cl. ...................................... 324/765; 324/754
(58) Field of Classification Search ...................... None
See application file for complete search history.

(56) References Cited

U.S. PATENT DOCUMENTS 5,071,359 A * 12/1991 Arnio et al. ................... 439/91
5,926,029 A * 7/1999 Ference et al. ............... 324/762
7,028,398 B2 * 4/2006 Haseyama et al. ............ 29/842

FOREIGN PATENT DOCUMENTS

JP 8-17498 1/1996
JP 10-221375 8/1998

(Continued)

OTHER PUBLICATIONS

Patent Abstracts of Japan, Publication No. 2002-075489 dated Mar. 15, 2002, 1 page.

(Continued)

*Primary Examiner*—Minh N Tang
(74) *Attorney, Agent, or Firm*—Osha • Liang LLP

(57) ABSTRACT

Provided is an anisotropic conductive sheet (8) having heat resistance and cold resistance and suitable for connection of electrodes. The anisotropic conductive sheet of the present invention has conductivity in the thickness direction, wherein the base film (1), which is a film made of synthetic resin having an electrical insulation property, has a plurality of holes (3) formed in the thickness direction, and the holes (3) are open to one main surface of the base film and closed to the other main surface, wherein a metal is adhered to the closed parts (2a) and the inner walls (2b) of the holes (3) so that by contacting electrodes (7) with the closed parts (2a) respectively from the outside, the electrodes (7) can electrically be connected through the adhered metal to the main surface where the holes (3) are open.

5 Claims, 5 Drawing Sheets

FOREIGN PATENT DOCUMENTS

| | | |
|---|---|---|
| JP | 10-247575 | 9/1998 |
| JP | 2002-075489 | 3/2002 |
| JP | 2003-533863 | 11/2003 |
| JP | 2005142111 | 6/2005 |
| JP | 2005-294131 | 10/2005 |
| JP | 2006-209400 | 8/2006 |

OTHER PUBLICATIONS

Abstract of JP2005-294131 from esp@cenet.com, 1 page, (Oct. 20, 2005).
Patent Abstracts of Japan, Publication No. 10-247575, dated Sep. 14, 1998, 1 page.
Patent Abstracts of Japan, Publication No. 2006-209400, dated Aug. 10, 2006, 1 page.
Patent Abstracts of Japan, Publication No. 10-221375, dated Aug. 21, 1998 1 page.
International Search Report issued in PCT/JP2006/322271, mailed on Feb. 6, 2007, 2 pages.
Office Action in Chinese Patent Application No. 200680043455.5 dated Aug. 28, 2009 and English translation thereof (15 pages).
Patent Abstracts of Japan, Publication No. 2005-142111 published Jun. 2, 2005 (1 page).

* cited by examiner (a)

(b)

(a)

(b)

(c)

(d)

(a)

(b)

(c)

(d)

(e)

(a)

(b)

(c)

ANISOTROPIC CONDUCTIVE SHEET, ITS PRODUCTION METHOD, CONNECTION METHOD AND INSPECTION METHOD

TECHNICAL FIELD

The present invention relates to an anisotropic conductive sheet which suits connection to a semiconductor wafer, a semiconductor chip, or a circuit board. The semiconductor chips are, for example, a ball grid array (BGA), a land grid array (LGA), a chip size package (CSP), and the like. The present invention also relates to a connection method and an inspection method in which such an anisotropic conductive sheet is used. Furthermore, the invention relates to a production method for an anisotropic conductive sheet having heat resistance and cold resistance and which is superior in productivity.

BACKGROUND ART

Semiconductor wafers for an IC or LSI are subject to an inspection for electrical connection or the like after its manufacture. The inspection is conducted under an atmosphere of high temperature, 150° C. to 200° C., which is higher than the usual operation temperature of the semiconductor wafer, so that defective products may be removed in a short time by the accelerated test. Therefore, this test is called a burn-in test, and the material used in the inspection equipment for the test must have heat resistance. On the other hand, in the case of a device for a motor vehicle or the like, an inspection is conducted at a temperature of –30° C. or less because operation security under cryogenic temperature is required of the device; therefore the material used in the inspection equipment for such inspection must have cold resistance.

The burn-in test of a semiconductor wafer is performed through electrodes on the surface of the semiconductor wafer. In that case, since the height of the electrodes as well as the height of the electrodes of the inspection equipment is varied, it is necessary to eliminate a contact failure due to the variations in the height of the electrodes. Therefore, the inspection is done with a soft flat conductive sheet put between the electrodes. This conductive sheet has conductive parts which are arranged along the pattern of the electrodes on the semiconductor wafer surface and which are insulated in the surface direction such that conduction is achieved in the thickness direction at the conductive parts while no conduction occurs between the electrodes. Therefore, this sheet is called an anisotropic conductive sheet. The anisotropic conductive sheet is used not only for the inspection of a semiconductor wafer but also for eliminating a contact failure due to variation in the electrode height when a packaged semiconductor wafer is mounted on a printed circuit board or the like.

Examples of packages housing semiconductor wafers include a surface mounting-type package, such as BGA or LGA, and a through hole mounting-type package such as a pin grid array (PGA). Of these packages, the BGA is structured such that ball-shaped electrodes are arranged in array on the rear surface of a package so that the ball-shaped electrodes are used instead of a lead wire. Thus, when the package is used, it is pushed against the anisotropic conductive sheet so as to achieve sufficient connection.

FIG. 5 is a diagram showing a structure and mounting condition of a conventional anisotropic conductive sheet. FIG. 5 illustrates examples of anisotropic conductive sheets used for a connection of bump electrodes such as a BGA (see Japanese Patent Application Publication No. H 10-221375 (Patent document 1)). FIG. 5(a) is a sectional view of the anisotropic conductive sheet before mounting a semiconductor wafer, and FIG. 5(b) is a sectional view showing a condition after the mounting of a semiconductor wafer 56. As shown in FIG. 5(a), this anisotropic conductive sheet 50 is constituted by an insulative part 51 consisting of a flexible film made of an insulative resin such as polyimide, polyester, or the like, and a conductive part 52 made of copper, gold, or the like. In the insulative part 51, a connection hole 53 is formed in the shape of a truncated cone at the same position as a bump electrode 57 of the semiconductor wafer 56.

Once the semiconductor wafer 56 is mounted, as shown in FIG. 5(b), the bump electrode 57 of the semiconductor wafer 56 is inserted into the connection hole 53 and touches the conductive part 52, which results in conduction. Also, it is stated that even if the semiconductor wafer 56 is pressed onto the sheet, the conductive part 52 will be prevented from being damaged because the pressing force will disperse without concentrating onto the conductive part 52 since the bump electrode 57 is supported by touching with the wall face of the connection hole 53. It is also stated that the electrical connection can be ensured further by providing a protrusion 58 such as a metallic pin or the like on the conductive part 52 at the bottom of the connection hole 53 as shown in FIG. 5(c).

[Patent document 1] Japanese Patent Application Publication No. H 10-221375

DISCLOSURE OF INVENTION

Problems to be Solved by the Invention

However, the anisotropic conductive sheet shown in FIG. 5 cannot sufficiently absorb variations in the height of the bump electrodes 57 since the sheet is structured to achieve conduction by the contact between the inflexible conductive part 52 and the bump electrodes 57, even if the insulative part 51 consisting of a synthetic resin film has some flexibility. Accordingly, some of the bump electrodes 57 may fail to achieve conduction, and if the pressing force of the semiconductor wafer 56 and the anisotropic conductive sheet 50 is increased, it will lead to a damage of the bump electrodes 57 and the conductive part 52. Also, if the protrusion 58 such as a metallic pin is provided at the bottom of the connection hole 53, it will damage the surface of the bump electrode 57 every time the connection is done, which will result in contact failure. On the other hand, since the anisotropic conductive sheet has a two-layer structure of the conductive part 52 made of copper or the like and the insulative part 51 consisting of a synthetic resin film, exfoliation may easily be caused between the conductive part 52 and the insulative part 51, if a burn-in test of 150° C. to 200° C. or cold resistant test of –30° C. or lower is repeated.

An object of the present invention is to provide an anisotropic conductive sheet which has heat resistance and cold resistance and which suits connection with electrodes, and its production method. Another object of the invention is to provide a connection method and an inspection method in which such anisotropic conductive sheet is used.

Means for Solving the Problems to be Solved

One embodiment of the present invention is an anisotropic conductive sheet having conductivity in the thickness direction, wherein the base film thereof is a film made of synthetic resin having an electrical insulation property and the base film has a plurality of holes formed in the thickness direction in a manner such that the holes are open to one main surface of the base film and closed to the other main surface, wherein a metal is adhered to the inner wall and the closed part of the holes so that the main surface on the side where the holes are open is electrically connected through the metal to electrodes by contacting the electrodes respectively with the closed part from the outside. The synthetic resin is preferably an expanded polytetrafluoroethylene.

The anisotropic conductive sheet of the present invention can be made by forming holes in a thickness direction with a drill or by means of laser beams or X-rays of synchrotron radiation. The connection method of the present invention is characterized in that the connection is achieved by contacting the electrodes of a semiconductor chip or circuit board with the closed part of the holes of the anisotropic conductive sheet. Also, the inspection method of the present invention is characterized in that the inspection is done by contacting electrodes of an inspection article with the closed parts of the holes of the anisotropic conductive sheet in an electrical inspection of semiconductor chips or circuit boards.

ADVANTAGEOUS EFFECT OF THE INVENTION

The anisotropic conductive sheet of the present invention, which is suitable for connection of electrodes of a BGA or the like, can fully achieve electrical conduction between electrodes pressed onto the sheet and the main surface on the hole opening side of the sheet, flexibly coping with variations in the height of the electrodes and positional discrepancies at the time of the connection. Also, the anisotropic conductive sheet of the present invention can be used repeatedly, regardless of difference in the width of the electrodes, and the connection reliability is high. Moreover, it has heat resistance and cold resistance, and its down-sizing and thinning, as well as making a fine pitch of electrodes, can easily be accomplished.

DESCRIPTION OF REFERENCED NUMERALS 1, 21 base film, 2a closed part, 2b inner wall, 3 hole, 7, 27 electrode, 8, 28 anisotropic conductive sheet, 9, 29 semiconductor wafer

BEST MODE FOR CARRYING OUT THE INVENTION

Anisotropic Conductive Sheet

Figure 1:
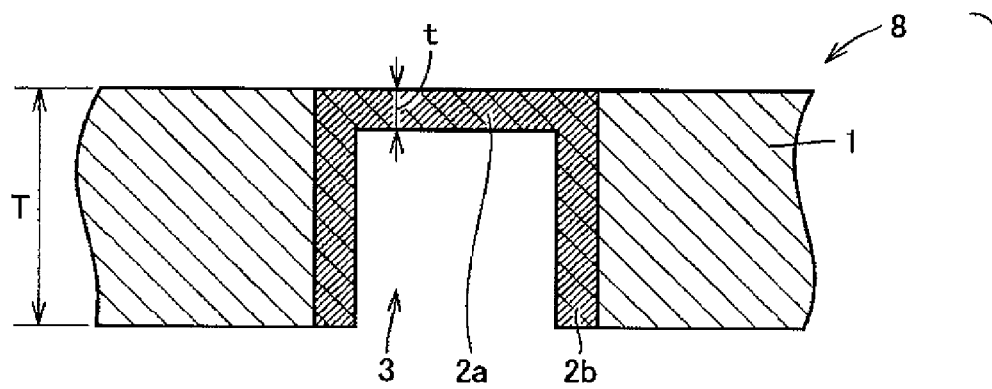
FIG. 1 Diagrams showing a structure and mounting condition of an anisotropic conductive sheet of the present invention.
Figure 1:
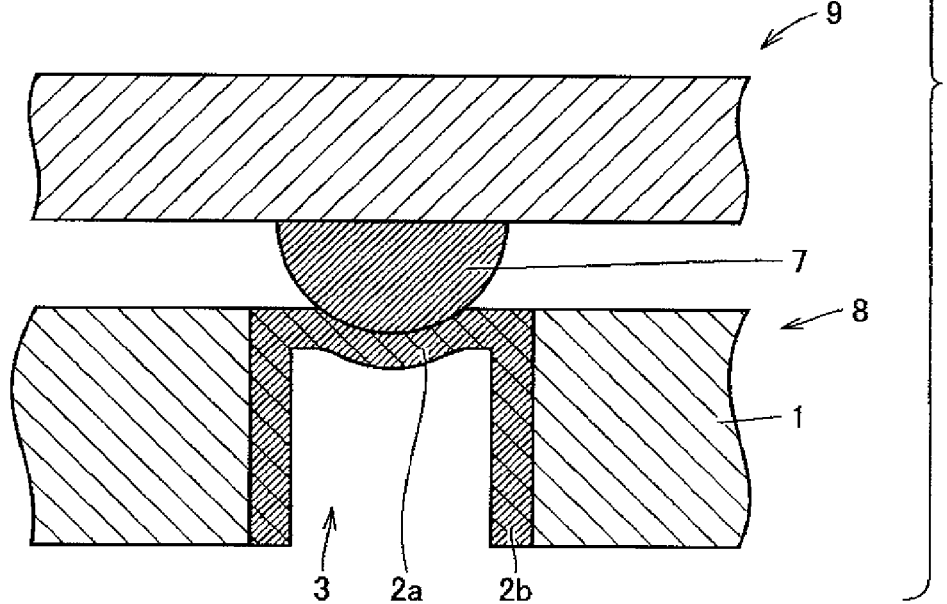

FIG. 1 includes diagrams showing a structure and mounting condition of an anisotropic conductive sheet of the present invention. As shown in FIG. 1(a), the anisotropic conductive sheet of the present invention is an anisotropic conductive sheet 8 having conductivity in the thickness direction, wherein the base film thereof is a film 1 made of synthetic resin having electrical insulation property and the base film has a plurality of holes 3 formed in the thickness direction. The hole 3 is open to one main surface of the base film and closed to the other main surface, wherein the closed part 2a and the inner wall 2b of the hole 3 are provided with a metal. FIG. 1(b) shows a condition in which a semiconductor wafer 9 is mounted onto the anisotropic conductive sheet 8. As shown in FIG. 1(b), the main surface on the side where the hole 3 is open can electrically be connected through the metal adhered to the inner wall 2b and the closed part 2a of the hole 3 to the electrode 7 of the semiconductor wafer 9 by contacting the electrode 7 with the closed part 2a from the outside.

The base film 1 is preferably a porous film, which is a flexible elastic sheet; hence the base film can softly connect with an electrode 7 of a semiconductor wafer 9 in such a manner as to wrap the surface of the electrode 7 as the closed part of the hole 3 bends as shown in FIG. 1(b) when the film touches the electrode. Thus, it is possible to achieve highly reliable connection by flexibly absorbing variations in the height of connecting electrodes. Also, highly reliable connection can be obtained, because connection can be made by absorbing a variation in the position of the electrode 7 even if the semiconductor wafer 9 suffers from thermal expansion or contraction due to temperature variation, resulting in displacement between the center of the hole 3 and the center of the electrode 7. Thus, the anisotropic conductive sheet of the present invention, which has heat and cold resistance properties, can be used under a severe environment such as a burn-in test performed under a high temperature atmosphere of 150° C. or higher, or a cold resistance test conducted at a low temperature of −30° C. or lower.

Figure 2:
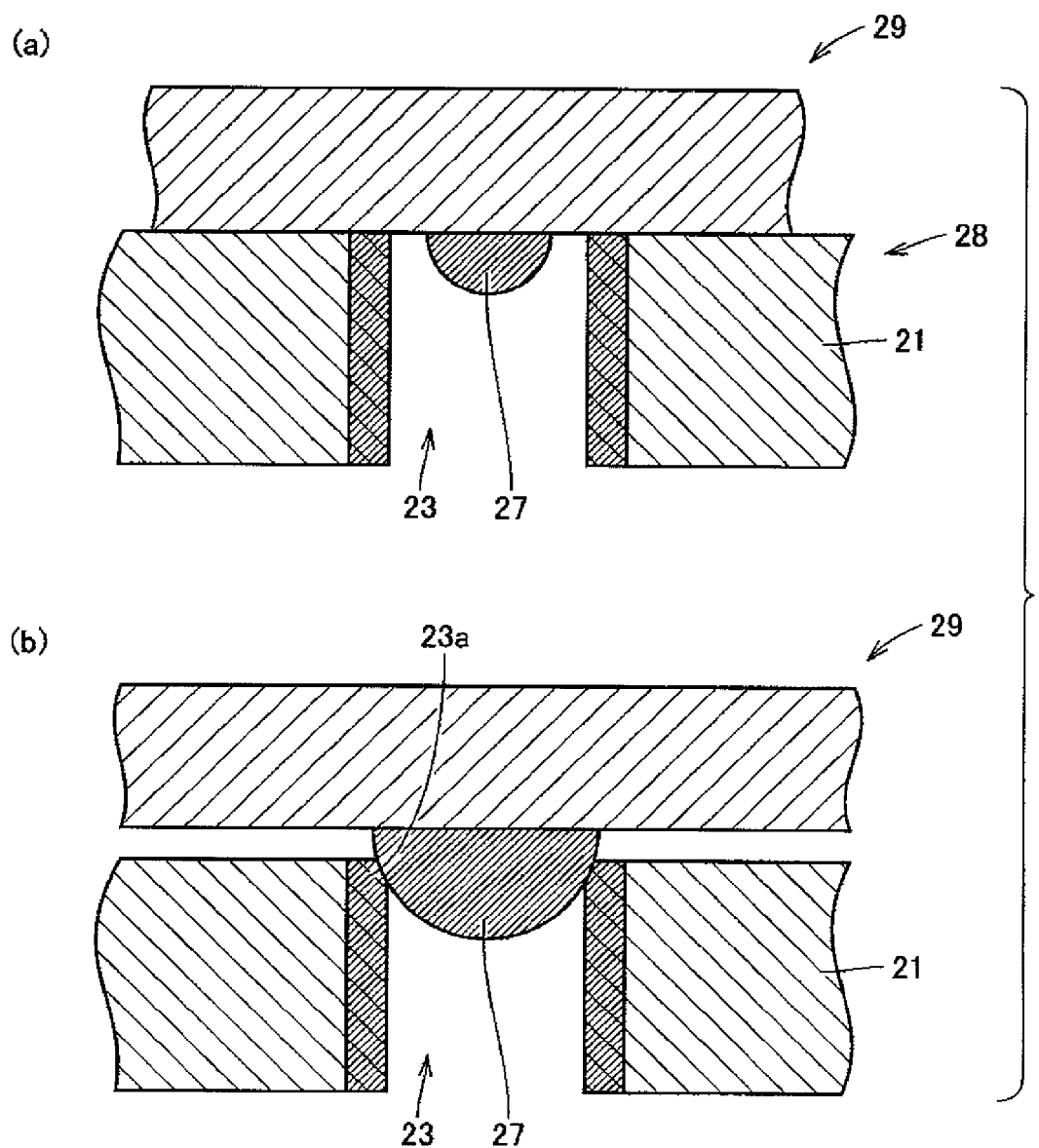
FIG. 2 Diagrams showing a structure and mounting condition of an anisotropic conductive sheet having a through hole that is outside of the present invention.

FIG. 2 includes diagrams showing a structure and mounting condition of an anisotropic conductive sheet having a through hole that is outside of the present invention. As shown in FIG. 2(a), when the diameter of an electrode 27 of a semiconductor wafer 29 is smaller than the diameter of a through hole 23, there may be a case where electrical connection cannot be obtained even if the electrode 27 is pressed onto an anisotropic conductive sheet 28. Also, when the diameter of the electrode 27 of the semiconductor wafer 29 is larger than the diameter of the through hole 23 as shown in FIG. 2(b), the end 23a of the through hole 23 spreads as a result of pressing by the electrode 27, and if the elasticity in the surface direction of a base film 21 is not sufficient, the base film 21 may fail to fully restore the spread, resulting in degradation of the connection reliability, and hence inability of repeated use.

The hole which is formed in the anisotropic conductive sheet of the present invention is open to one main surface and closed to the other main surface. As shown in FIG. 1(b), therefore, when the electrode 7 is pressed onto the closed part 2a, the closed part 2a connects flexibly to the electrode 7 in a wrapping manner, and when the electrode is removed, the closed part 2a recovers its original form. Therefore, regardless of the shape and size of the electrode 7, a highly reliable connection can be maintained even if such pressing is repeated. Particularly, it is useful in that sure connection is obtained even in the case of an electrode which has an inclined side face, such as a solder bump or a solder ball. Therefore, the connection method of the present invention, in which a connection is made by contacting an electrode of a semiconductor chip or a circuit board with the closed part of a hole of an anisotropic conductive sheet from the outside, is advantageous in that flexible and sure connection can be achieved. Also, the inspection method of the present invention which is performed in a similar manner is most suitable for the electrical inspection of a semiconductor chip or circuit board.

The hole of an anisotropic conductive sheet of the present invention is open to one main surface and closed to the other main surface. Such a structure is advantageous in that electrical connection can be obtained by deformation with lower pressure as compared with a hollow structure in which the main surfaces are both closed. Therefore, according to the present invention, an inspection can be accomplished without damage or with smaller damage to each electrode of an inspection article. Also, in an actual inspection, it is possible to achieve electrical connection by compressing electrodes on the order of thousands or tens of thousands of pieces altogether, and accordingly the total load can be reduced, resulting in reduced damage of inspection articles as a whole, and hence reduced occurrence of crack, or the like. Also, it is possible to simplify inspection equipment by making the structure suitable for lower load.

The base film is a film consisting of synthetic resin and having electrical insulation property. Thus, by using a material having electrical insulation property, it is possible to afford the base film with insulation property in the surface direction to eliminate the mutual influence of adjacent electrodes. The base film is provided with a plurality of holes formed in the thickness direction, and a metal is adheres to the closed part and inner wall of the holes. Therefore, as shown in FIG. 1(b), by pressing the electrode 7 onto the closed part 2a of the hole 3 from the outside, the electrode 7 and the main surface where the hole 3 is closed are electrically connected together through the metal of the closed part 2a and the inner wall 2b. Therefore, the conductive sheet of the present invention has conductivity only in the thickness direction.

The synthetic resin for forming a base film is preferably polyester, polyamide, polyolefin, polyurethane, or the like in view of electrical insulation and flexibility, and they can be used in a form of a film, woven fabric, nonwoven fabric, or the like. Also, a fluoro-substituted polymer is more preferable from the view point of superior heat resistance, chemical resistance, processability, mechanical characteristics, dielectric property (low dielectric constant), etc. Examples of fluoro-substituted polymers include polytetrafluoroethylene (hereinafter, also called "PTFE"), tetrafluoroethylene/hexafluoropropylene copolymer, tetrafluoroethylene/perfluoroalkylvinylether copolymer, polyvinylidene fluoride, polyvinylidene fluoride copolymer, ethylene/tetrafluoroethylene copolymer, etc.; from the view point of heat resistance, cold resistance, processability, and mechanical strength, expanded polytetrafluoroethylene is particularly preferable, which is capable of maintaining a stable connection without losing elasticity even at a high temperature of 200° C. or more as well as a low temperature of −300° C. or less. Also, it is possible to use engineering plastics such as polyimide, polyamide-imide, modified polyphenylene ether, polyphenylene sulfide, polyether ether ketone, polysulfone, polyethersulfone, liquid crystalline polymer, etc.

Since a base film has resiliency and flexibility, by using a porous material for the base film, it is made possible to ease contact failure due to the positional discrepancy of an electrode when a semiconductor wafer is mounted, and hence to achieve a sure and soft connection. From such a viewpoint, preferably the mean pore size of the pores contained inside the porous material is 10 μm or less, and the bubble point is preferably 2 kPa or more. Also, from the viewpoint of achieving a fine pitch of conductive part, the mean pore size is more preferably 1 μm or less, and the bubble point is more preferably 10 kPa or more. Thus, by making the mean pore size equal to or less than 10 μm, or making the bubble point equal to or more than 2 kPa, the film strength can be enhanced to facilitate the ease of its use.

The porosity of the porous material is preferably 20% to 80%. By making the porosity equal to or more than 20%, the resiliency and flexibility of the porous material can be maintained. On the other hand, by making the porosity equal to or less than 80%, sufficient film strength can be secured. The term "porosity" means a ratio (%) of the volume of pore portions to the whole volume of the porous material.

As shown in FIG. 1(a), when the hole 3 is formed using a drill, laser beam, or X ray of synchrotron radiation, the thickness T of the base film 1 can be made a maximum of 3 mm; preferably 0.1 mm to 2 mm, considering the processability, though the thicker the better from the viewpoint of securing sheet flexibility; and T may be 1 mm, for example. Accordingly, it is possible to decrease the size and thickness of the anisotropic conductive sheet.

A metal can be adhered to the closed part and the inner wall of a hole by plating with a catalyst adhered to the closed part and the inner wall surface of the hole. For such plating, an electroless plating method can suitably be adopted. First, prior to the electroless plating, a catalyst is adhered to the inner wall surface and the closed part of the hole, and thereafter the remaining catalyst (palladium-tin) is activated. More specifically, the palladium catalyst is activated by dissolving tin by means of immersion in such an organic acid salt for activation of a plating catalyst as is available on the market.

Next, the base film to which the activated catalyst is adhered is immersed in an electroless plating solution, thereby depositing a conductive metal only on the closed part and the inner wall surface of the hole so as to form a conductive part (also called "electrically conductive path" or "electrode"). Examples of such conductive metals include copper, nickel, silver, gold, nickel alloy, and the like; copper is preferable in the case where particularly high conductivity is necessary.

When an expanded porous PTFE sheet is used as the base film, plating particles (crystal grains) are first deposited, in such a manner as if they are entangled, onto the fibrils exposed to the surface of the porous PTFE sheet, and the adhering condition of the conductive metal can be controlled by adjusting the plating time. If the electroless plating time is too short, the quantity of the deposited metal will be too small to secure sufficient conduction. In contrast, if the electroless plating time is too long, the thickness of the layer in which the metal is deposited becomes too thick, resulting in a metallic solid mass, and accordingly the elasticity restoration power of the porous film will decrease. By making the plating quantity moderate so as to adhere the conductive metal while maintaining a state of porous structure, it is made possible to secure sufficient resiliency and flexibility, as well as to secure the conductivity in the film thickness direction. The thickness of a fibril of the porous film, which consists of expanded porous PTFE or the like, is preferably 50 μm or less, and the particle diameter of the conductive metal is preferably about 0.001 μm to 5 μm. Also, the quantity of the adhered conductive metal is preferably about 0.01 g/cm$^3$ to 4.0 g/cm$^3$ to maintain porous structure and resiliency.

As shown in FIG. 1(b), once the electrode 7 is pressed onto the closed part 2a, the conductive metal of the closed part 2a is pressed to the electrode 7 by the resiliency of the closed part 2a. Thus, the electrode 7 and the conductive metal are connected together, and thereby the electrode 7 and the main surface where the hole 3 is open can electrically be connected together securely through the metal of the inner wall 2b. Once the electrode 7 is removed, the closed part 2a, which consists of a porous film or the like, recovers itself by its resiliency. Therefore, the electrode can repeatedly attached or removed in a case of inspection, or the like.

As shown in FIG. 1(a), the thickness t of the closed part 2a of the hole 3 is preferably 10 μm to 100 μm, and more preferably 30 μm to 80 μm. By making the thickness t equal to or more than 10 μm, a sufficient strength against pressing by the electrode 7 is obtained, and hence the restoration power can be secured. On the other hand, when the thickness t is made equal to or less than 100 μm, the metal uniformly adheres to the closed part 2a, securing sufficient conductivity while maintaining the flexibility of the closed part.

From the viewpoint of enhancing electric contactability and prevention of oxidation, the metal adhered in this manner is preferably covered with an antioxidant, precious metal, or alloy of precious metal. The precious metal is preferably palladium, rhodium, or gold in view of low electric resistance. The thickness of a coating layer of precious metal or the like is preferably 0.005 μm to 0.5 μm, and more preferably 0.01 μm to 0.1 μm. If the thickness of the coating layer is too thin, the improvement in electric contactability is less, and if too thick, the coating layer tends to easily peel off. Also, for the purpose of coating with gold, it is effective to conduct immersion gold after covering with a nickel layer of about 8 nm.

Production Method of Anisotropic Conductive Sheet

Embodiment 1

Figure 3:
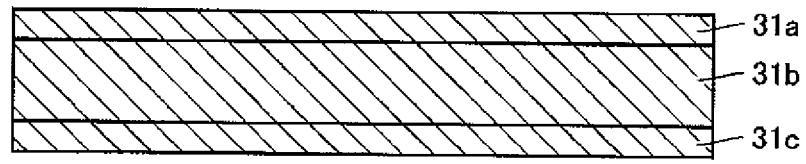
FIG. 3 Diagrams showing production processes of the present invention for making an anisotropic conductive sheet.
Figure 3:
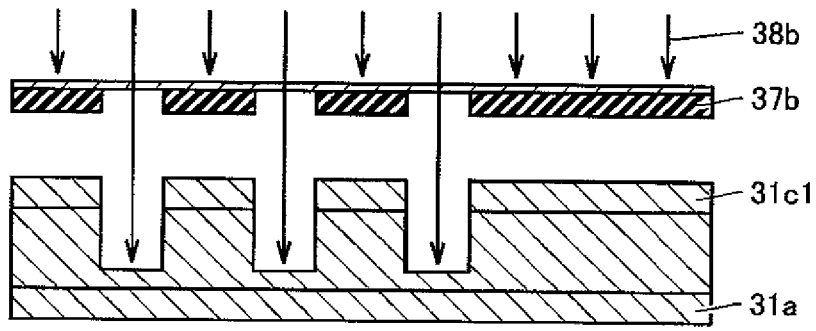
Figure 3:
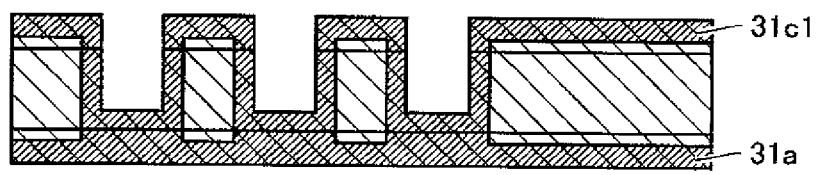
Figure 3:
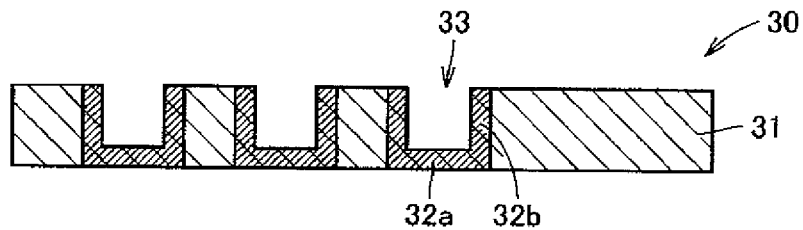

A production method of the present invention for making an anisotropic conductive sheet is characterized in that a hole is formed in the thickness direction by irradiating an X-ray of synchrotron radiation or a laser beam. FIG. 3 includes diagrams showing the steps of manufacturing an anisotropic conductive sheet of the present invention. First, as shown in FIG. 3(a), a polytetrafluoroethylene sheet having a thickness of 600 μm, for example, is prepared as a base film 31b, and sacrifice layers 31a and 31c are formed on the two main surfaces of the base film 31b. The sacrifice layers 31a and 31c are preferably made of the same material, that is, polytetrafluoroethylene, in view of enhancement of exfoliation and adhesion with the base film 31b. The sacrifice layers 31a and 31c, respectively having a thickness of about 100 μm, can be formed by hot-melt adhesion or the like.

Next, as shown in FIG. 3(b), holes are formed in the thickness direction in the following manner: laser beams or X-rays 38b of synchrotron radiation is irradiated through a mask absorber having a given pattern while the radiation energy and irradiation time is adjusted, and thereby the sacrifice layer 31c and the base film 31b are partially decomposed and removed.

Preferably, the X-ray to be irradiated is an X-ray of synchrotron radiation. In the case of ablation by the X-ray of synchrotron radiation, a plurality of predetermined holes can be formed at the same time only in one process of exposure, and the developing process after exposure is unnecessary. Moreover, since the ablation speed is so fast as 100 μm/minute, the photon cost can substantially be reduced, allowing easy processing at a large aspect ratio: a width of tens of μm and a height of thousands of μm. Also, the predetermined hole can be formed with a laser beam as well: the size and cost of equipment are small; the processing is easy; and as in the case of X-ray by synchrotron radiation, it is easy to achieve a fine pitch of electrode. Particularly, if a laser beam having a short pulse of 10 ps or less is used, the hole can be formed without destroying the microstructure of the base film. Also, it is possible to form such a hole using a drill which will be described in Embodiment 2.

Next, as shown in FIG. 3(c), a metal is adhered by electroless plating. The plating method is superior in productivity and capable of affording electrical conductivity at once. There are various ways in the electroless plating method; in the case of electroless copper plating, for example, it may be done as follows: a pre-dip is done using CR-3023 made by Nikko Metalplating; next, a catalyst to be used may be CP-3316 made by Nikko Metalplating, and plating promoters may be NR-2 A and NR-2B, which are made by Nikko Metalplating, and NKM554 made by Nikko Metalplating may be used for plating.

After that, sacrifice layers 31a and 31c1 are peeled off, then an anisotropic conductive sheet of the present invention, such as a sheet 30 shown in FIG. 3(d), is obtained. This anisotropic conductive sheet 30 has a base film 31, which is a porous film made of polytetrafluoroethylene and having an electrical insulation property, and the base film 31 has a plurality of holes 33 formed in the thickness direction. The holes 33 are open to one main surface of the base film 31 and closed to the other main surface, and a metal is adhered to the closed part 32a and inner wall 32b of the holes 33. Thus, by contacting an electrode with the closed part 32a of the hole 33 from the outside, the electrode and the main surface where the hole 33 is open are electrically connected through the adhered metal, and thereby electrical conductivity in the thickness direction is achieved.

Embodiment 2

Figure 4:
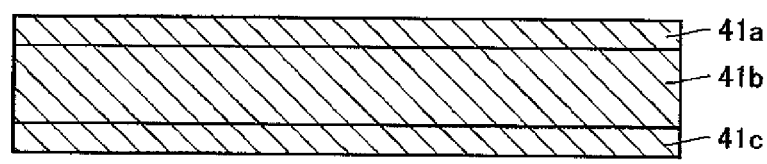
FIG. 4 Diagrams showing production processes of the present invention for making an anisotropic conductive sheet.
Figure 4:
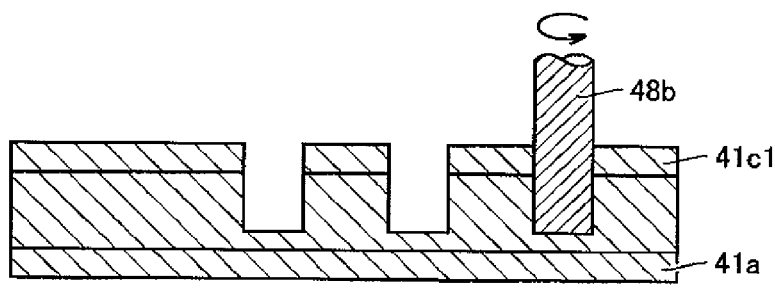
Figure 4:
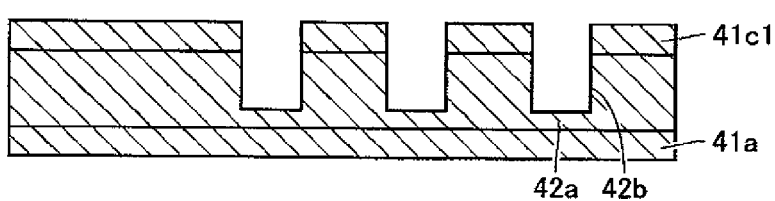
Figure 4:
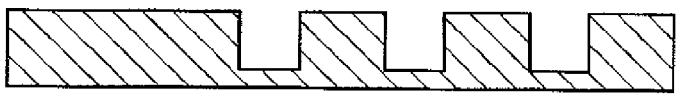
Figure 4:
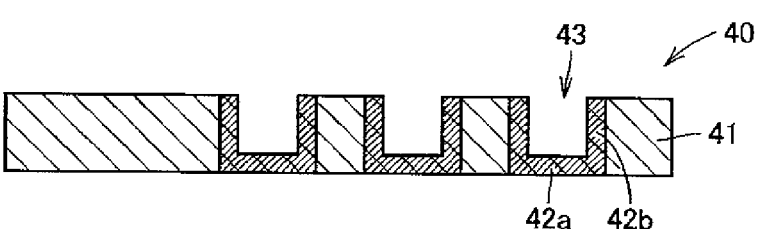
Figure 5:
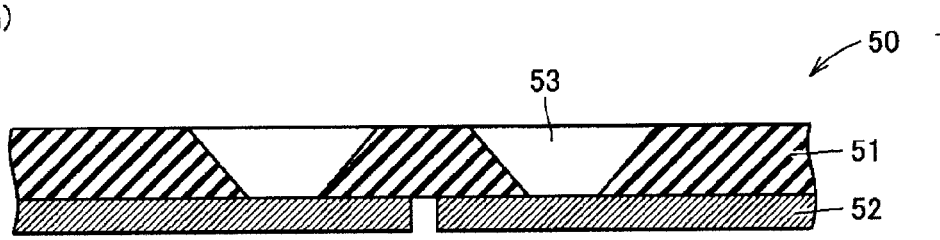
FIG. 5 Diagrams showing a structure and mounting condition of a conventional anisotropic conductive sheet.
Figure 5:
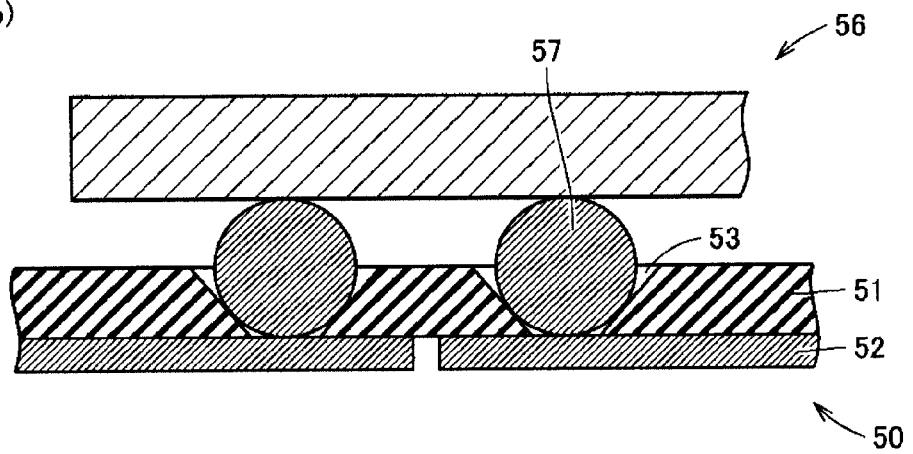
Figure 5:
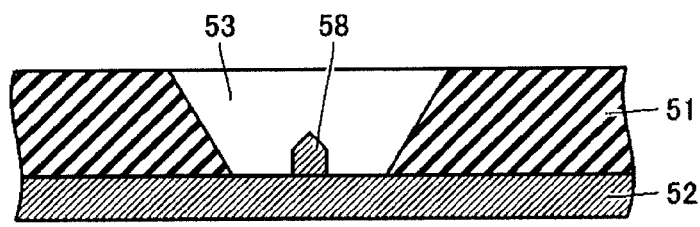

Another embodiment of the production method of the present invention for making an anisotropic conductive sheet is characterized in that a hole is formed with a drill in the thickness direction. FIG. 4 includes diagrams showing production processes of the present invention for making an anisotropic conductive sheet. First, as shown in FIG. 4(a), sacrifice layers 41a and 41c made of polytetrafluoroethylene and each having a thickness of 100 μm are formed on two main surfaces of a base film consisting of a polytetrafluoroethylene sheet having a thickness of 1 mm.

Next, as shown in FIG. 4(b), a hole is formed with a drill 48b from the side of the sacrifice layer 41c at a predetermined depth in the sacrifice layer 41c and the base film 41b. A given hole can be formed with a laser beam or an X-ray of synchrotron radiation; however, by forming the hole with a micro drill, the production cost can be reduced since the equipment for generating laser or X-ray is expensive. For example, a hole having a diameter of 100 μm or more can simply be formed using a drill (e.g., hard metal microdrill, SCMMR, made by Daiwa Seiko, Co., Ltd.) having a blade diameter of 100 μm or more and a blade length of 1.5 mm or more.

In order to improve processability, a preferable mode is such that a porous polytetrafluoroethylene sheet is filled with fused paraffin and solidified by cooling prior to the drilling process. In such embodiment, the hole portion of porous PTFE can be suppressed from being deformed or collapsed by the mechanical load due to the drill processing. The filled paraffin can easily be removed with xylene or the like after the drilling process.

Another preferable mode is such that the mechanically formed hole of a PTFE sheet, which tends to suffer from roughness of its sidewall surface or destruction of the hole after the drill processing, is subjected to slight etching of the sidewall so that the sidewall is restored. The etching can be done with an etching solution which contains an alkali metal. Also, the alkali metal is preferably sodium or lithium.

Next, catalyst particles (not illustrated) which facilitate a reduction reaction are adhered to the whole surface including the closed part 42a and inner wall 42b of the hole as shown in FIG. 4(c). For example, for the purpose of electroless copper plating, Pd—Sn colloid catalyst imparting solution is impregnated as the catalyst. After that, as shown in FIG. 4(d), the sacrifice layers 41a and 41c1 are peeled off. The removal of the sacrifice layers results in a state where the catalyst particles for facilitating the electroless plating are formed only on the closed part 42a and inner wall 42b of the hole. Subsequently, the electroless plating is performed, whereby the metal adheres only to the closed part 42a and inner wall 42b of the hole. Thus, an anisotropic conductive sheet 40 as shown in FIG. 4(e) is obtained.

The anisotropic conductive sheet 40 thus obtained comprises a base film consisting of a porous film 41 made of synthetic resin and having an electrical insulation property, and the base film has a plurality of holes 43 formed in the thickness direction. The hole 43 is open to one main surface of the base film and closed to the other main surface, and the metal is adhered to the closed part 42a and inner wall 42b of the hole 43. Consequently, by contacting an electrode with the closed part 42a of the hole from the outside, the electrode and the main surface where the hole 43 is open is electrically connected through the metal. Thus, the anisotropic conductive sheet has electrical conductivity in the thickness direction.

This embodiment also is superior in respect of productivity since electrical conductivity can be afforded at once by plating. Also, the anisotropic conductive sheet of the present invention can be manufactured by performing electroless plating without providing catalyst particles as in Embodiment 1; however this embodiment is favorable in that it is possible to efficiently plate solely on the region that is intended to be plated, that is, the closed part 42a and inner wall 42b of the hole 43.

The hole of the anisotropic conductive sheet of the present invention has an opening in the direction of one main surface and the direction of the other main surface is closed. Such mode is easier to form a hole and to control the thickness t of the closed part as compared with a mode in which a hole has a hollow structure that is closed in both of the main surfaces. Also, it is possible to easily adhere a metal to the closed part and inner wall of the hole by causing a plating solution to permeate from the opening.

It should be understood that the embodiments and examples disclosed herein are exemplary and not restrictive in all respects. The scope of the present invention is intended to be shown, not by the above description, but by the scope of a claim, including all modifications and equivalents thereof.

INDUSTRIAL APPLICABILITY

The anisotropic conductive sheet of the present invention is easy to decrease its size and thickness and to make a pitch of electrodes finer, and hence it is possible to meet the needs of miniaturization required of electronic equipment and information equipment.

The invention claimed is:

1. An anisotropic conductive sheet (8) having conductivity in the thickness direction, comprising a base film, wherein the base film (1) is a film made of synthetic resin having an electrical insulation property, wherein the synthetic resin comprises an expanded polytetrafluoroethylene, and the base film comprises an open main surface, a closed main surface, and a plurality of holes (3) formed in the thickness direction, the holes (3) being open to the open main surface of the base film and closed to the closed main surface, wherein a metal is adhered to closed parts (2a) and inner walls (2b) of the holes (3) so that the open main surface is electrically connected through the metal to electrodes (7) by contacting the electrodes with the closed parts respectively from the outside.

2. A production method of an anisotropic conductive sheet (8) as set forth in claim 1, comprising:
   preparing a base film comprising two main surfaces;
   forming sacrifice layers on the two main surfaces of the base film;
   irradiating the sacrifice layers and the base film with laser beams or X-ray of synchrotron radiation through a mask absorber to form holes in the thickness direction of the sacrifice layers and the base film;
   adhering a metal by electroless plating to the resultant sacrifice layers and the base film; and
   peeling off the sacrifice layers.

3. The anisotropic conductive sheet (8) of claim 2, wherein the sacrifice layers comprise polytetrafluoroethylene.

4. A production method of an anisotropic conductive sheet (8) as set forth in claim 1, comprising:
   preparing a base film comprising two main surfaces;
   forming sacrifice layers on the two main surfaces of the base film;
   forming holes in the sacrifice layers and the base film with a drill;
   adhering a plurality of catalyst particles to the whole surface of the hole, wherein the catalyst particles facilitate a reduction reaction;
   peeling off a sacrifice layer; and
   performing electroless plating to the resultant base film.

5. The anisotropic conductive sheet (8) of claim 4, wherein the sacrifice layers comprise polytetrafluoroethylene.

* * * * *